United States Patent
Gariboldi et al.

(10) Patent No.: US 10,910,831 B2
(45) Date of Patent: Feb. 2, 2021

(54) MONITORING SYSTEM TO MONITOR THE CONDITION OF AN INDUSTRIAL WIRING SYSTEM AND CORRESPONDING INDUSTRIAL WIRING SYSTEM

(71) Applicant: TECNIKABEL S.p.A., Turin (IT)

(72) Inventors: Roberto Gariboldi, Montanaso Lombardo (IT); Davide Bentivoglio, Settimo Torinese (IT)

(73) Assignee: TECNIKABEL S.P.A.

( * ) Notice: Subject to any disclaimer, the term of this patent is extended or adjusted under 35 U.S.C. 154(b) by 318 days.

(21) Appl. No.: 15/981,392

(22) Filed: May 16, 2018

(65) Prior Publication Data

US 2018/0337530 A1   Nov. 22, 2018

(30) Foreign Application Priority Data

May 17, 2017   (IT) .................. 102017000053259

(51) Int. Cl.
| | |
|---|---|
| *H02H 11/00* | (2006.01) |
| *G01R 31/50* | (2020.01) |
| *G01R 31/58* | (2020.01) |
| *H02H 5/10* | (2006.01) |

(52) U.S. Cl.
CPC .......... *H02H 11/001* (2013.01); *G01R 31/50* (2020.01); *G01R 31/58* (2020.01); *H02H 5/10* (2013.01)

(58) Field of Classification Search
CPC ........ H02H 11/001; H02H 5/10; G01R 31/50; G01R 31/58; H04B 3/46; H02J 13/00002; H02J 13/00006
See application file for complete search history.

(56) References Cited

U.S. PATENT DOCUMENTS

| | | | |
|---|---|---|---|
| 4,011,483 | A | 3/1977 | Meadows |
| 4,228,475 | A | 10/1980 | Sherwood |

(Continued)

FOREIGN PATENT DOCUMENTS

| | | |
|---|---|---|
| CA | 1193322 | 9/1985 |
| DE | 966596 | 8/1957 |

(Continued)

OTHER PUBLICATIONS

Corresponding Italian Search Report for IT 201700053259 dated Feb. 22, 2018. IT.

*Primary Examiner* — Kyle J Moody
(74) *Attorney, Agent, or Firm* — The Belles Group, P.C.

(57) ABSTRACT

A monitoring system is described, to monitor the condition of an industrial wiring system provided with a multipolar electric cable with a number of electric conductors having a power and/or data transmission function and enclosed inside a protective sheath, wherein: monitoring conductors, to monitor wear of the electric cable, are arranged inside the protective sheath electrically insulated from the electric conductors; and a monitoring device is operatively coupled to the monitoring conductors so as to detect at least one electric parameter associated with the monitoring conductors to detect the wear of the electric cable and generate corresponding monitoring data. The monitoring device obtains its own power supply from, and/or transmits the monitoring data by means of, the electric conductors of the same electric cable.

13 Claims, 4 Drawing Sheets

(56) References Cited

U.S. PATENT DOCUMENTS

| | | | | |
|---|---|---|---|---|
| 6,304,089 | B1 * | 10/2001 | Paulson | G01R 31/50 |
| | | | | 324/509 |
| 10,147,523 | B2 * | 12/2018 | Rengert | H01B 3/445 |
| 2018/0188310 | A1 * | 7/2018 | Koeppendoerfer | G01R 27/26 |
| 2019/0235006 | A1 * | 8/2019 | Ichikawa | G01N 27/409 |

FOREIGN PATENT DOCUMENTS

| | | |
|---|---|---|
| FR | 602929 | 4/1926 |
| FR | 933590 | 4/1948 |
| GB | 568336 | 3/1945 |
| GB | 716516 | 10/1954 |

* cited by examiner

MONITORING SYSTEM TO MONITOR THE CONDITION OF AN INDUSTRIAL WIRING SYSTEM AND CORRESPONDING INDUSTRIAL WIRING SYSTEM

PRIORITY CLAIM

This application claims priority from Italian Patent Application No. 102017000053259 filed on May 17, 2017, the disclosure of which is incorporated by reference.

TECHNICAL FIELD

The present solution relates to a system to monitor the condition of an industrial wiring system and to a corresponding industrial wiring system.

BACKGROUND OF THE INVENTION

The present application refers to patent application Ser. No. 102016000093633 filed on Sep. 16, 2016, entitled: "Monitoring and alert system for industrial cables", representing an improvement and an evolution thereof, with further innovation elements in respect to the state of the art.

The present solution, in fact, describes a system for monitoring the operating status of a wiring system for industrial use, such as those used in automation and robotics, in particular in the connections between moving electric devices, for example controlled electric motors (so-called servomotors), and the corresponding control systems.

The wiring system is adapted to transfer the power, or power supply, to the electric motor required for its actuation and also allows the exchange of data and control signals between the control system and encoder/resolver and/or other sensors associated with the same electric motor, in order to allow the control of the same, for example in a closed loop.

Although several implementation solutions exist, the general trend in these cabling applications envisages the use of a power/signal hybrid cable, i.e. a single cable that includes both insulated power or power supply conductors, with sections suitable for the passage of the required power, and pairs of "twisted" and isolated data conductors dedicated to the communication between the control system and the electric motor, in particular with the encoders/resolvers/sensors coupled to the same electric motor.

In the current control and management systems of electric motors and of the respective positioning and actuation, different implementation solutions exist which include proprietary solutions, both as a type of wiring and as a communication protocol and architecture with the motor, or solutions based on open communication standards, but all of them generally make use of suitable elements of the electric cable dedicated to the power supply and of suitable elements of the electric cable dedicated to data exchange.

The critical issues of these wiring systems mainly derive from their dynamic uses, with the respective electric cable that is subjected to continuous movements, also under very heavy stress. The use of chains, sheaths, or cable-conveying tubes or similar protection elements does not prevent rubbing and friction between the conductors of the electric cable and between the electric cable and the sheath or the chain, with consequent wear, even if only in specific points, and possible damage to the conductors.

The aforesaid patent application 102016000093633 describes, in order to overcome this problem, a system for monitoring a wiring system of the type indicated above, capable of assessing the wear state of the cable and capable of signaling the occurrence of damages on the cable before the latter come to cause failures and blocking situations of the electronic systems to which they are connected and of which they are part of, with serious economic damage and security risks.

However, that monitoring system has some problems, which do not allow full exploitation of the advantageous features.

In particular, the above monitoring system requires a dedicated power supply unit and furthermore, a transmission and reception unit for the communication of the monitoring data, for example in wireless mode, to an outer electronic system, for example to the electric motor control unit. Consequently, the monitoring system can have a resulting size, that makes it difficult to couple and integrate with the wiring system to be monitored; moreover, the monitoring system has a complexity and an implementation cost that may not be compatible with some application fields.

SUMMARY OF THE INVENTION

The aim of the present solution is to provide an improved monitoring system which allows to solve the aforesaid problems, and in particular that allows a simplification and a reduction of the complexity, the size and cost.

According to the present solution, a system to monitor the condition of an industrial wiring system and a corresponding industrial wiring system are therefore provided, as defined in the attached claims.

BRIEF DESCRIPTION OF THE DRAWINGS

For a better understanding of the present solution, preferred embodiments will now be described, purely by way of non-limiting example and with reference to the attached drawings, wherein:

FIG. 2b shows a side view, partially exploded, of the electric cable of FIG. 2a;

DETAILED DESCRIPTION OF THE INVENTION

As will be explained in detail below, a particular aspect of the present solution envisages providing a system to monitor the condition of a wiring system, in which the power supply is obtained from conductors in the electric cable of the same wiring system, normally already provided and dedicated to other purposes, with advantages in terms of size, cost and simplification of the same monitoring system.

According to a further aspect of the present solution, the monitoring data detected by the monitoring system are transmitted by using conductors already present in the electric cable of the associated wiring system, again simplifying and reducing the overall sizes and costs of the system and thus greatly simplifying the integration with the electronic systems already in use.

In some embodiments, again, as will be discussed in the following, the conductors already present in the electric cable, from which to draw the power supply, and the conductors already present in the same electric cable, through which transmit the monitoring data, can advantageously coincide, thus further simplifying the implementation of the monitoring system.

Figure 1:
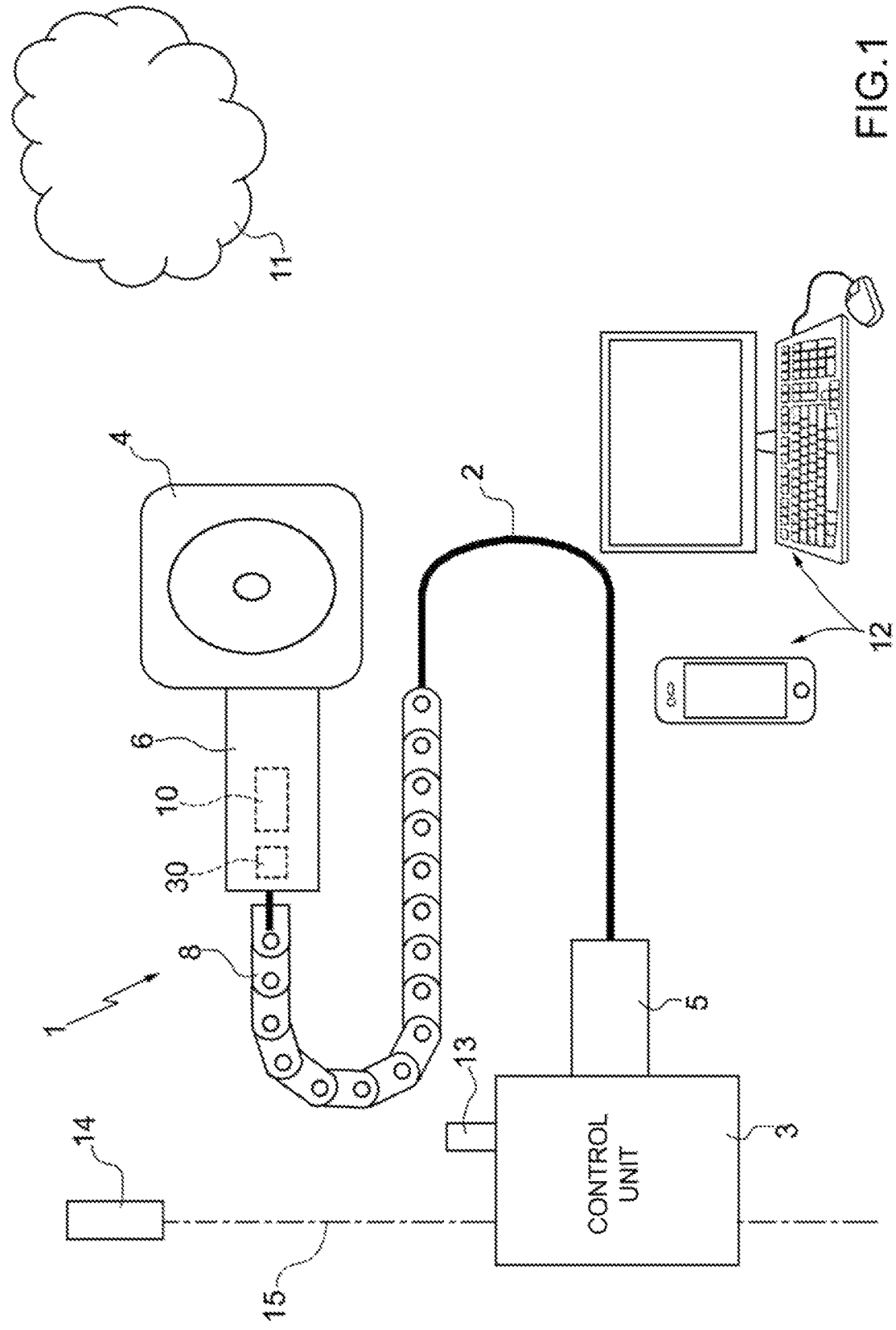
FIG. 1 shows a block diagram of a wiring system and of the corresponding monitoring system, according to the present solution.

Referring to FIG. 1, a wiring system for industrial use will now be described, generally denoted with 1, in which the present solution is advantageously applied.

The wiring system 1 comprises: an electric cable 2, of the hybrid multipolar type (power/signal), designed to perform the required functions, in the discussed embodiment designed for connecting, for example, a control unit 3 to an associated electric motor 4, which, typically, is coupled to a mobile system (for example a robotic arm providing movements having various degrees of freedom); a first connector 5, in a fixed or static position, coupled to a first end of the electric cable 2 and configured to electrically interface with the control unit 3; and a second connector 6, in a mobile position (i.e. adapted to be moved together with the aforesaid mobile system), coupled to a second end of the electric cable 2 and configured to electrically interface with the electric motor 4.

The wiring system 1 further comprises a protection element 8, a sheath or, as in the example shown, a chain, adapted to protect the electric cable 2 against external environmental stress.

According to an aspect of the present solution, a monitoring system 10, shown schematically herein, is suitably coupled to the wiring system 1, in order to monitor its operational state and prevent the occurrence of possible failures due to wear or breakage of the conductors of the respective electric cable 2; the monitoring system 10 can also be able to gather additional information on the conditions of the wiring system 1.

This information, and in general the monitoring data, in addition to being stored locally in the same monitoring system, can be made available at a remote storage unit (according to the so-called "cloud storage" modes), indicated schematically with 11, accessible by means of various electronic devices 12, such as a personal computer, a smartphone or a tablet.

In the embodiment illustrated in FIG. 1, the monitoring system 10 is advantageously integrated within the second connector 6 of the wiring system 1.

The monitoring data collected by the monitoring system 10 can be used to activate appropriate signals of a critical wear state of the wiring system 1, for example by turning-on an alarm light 13 and/or by the emission of sounds or the generation of other types of audio-visual indications by way of alarms means 14 suitably coupled thereto, directly in proximity to the wiring, exploiting a data network (or infrastructure) 15 already present in the installation site, or can be transmitted to the remote memory unit 11 (cloud storage).

Figure 2B:
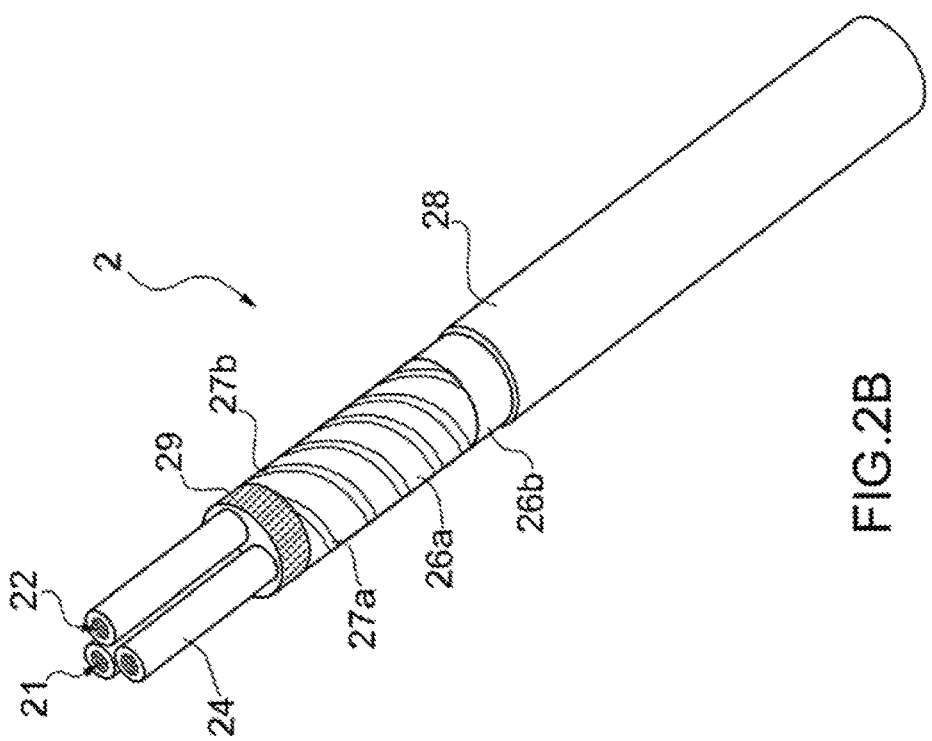
Figure 2A:
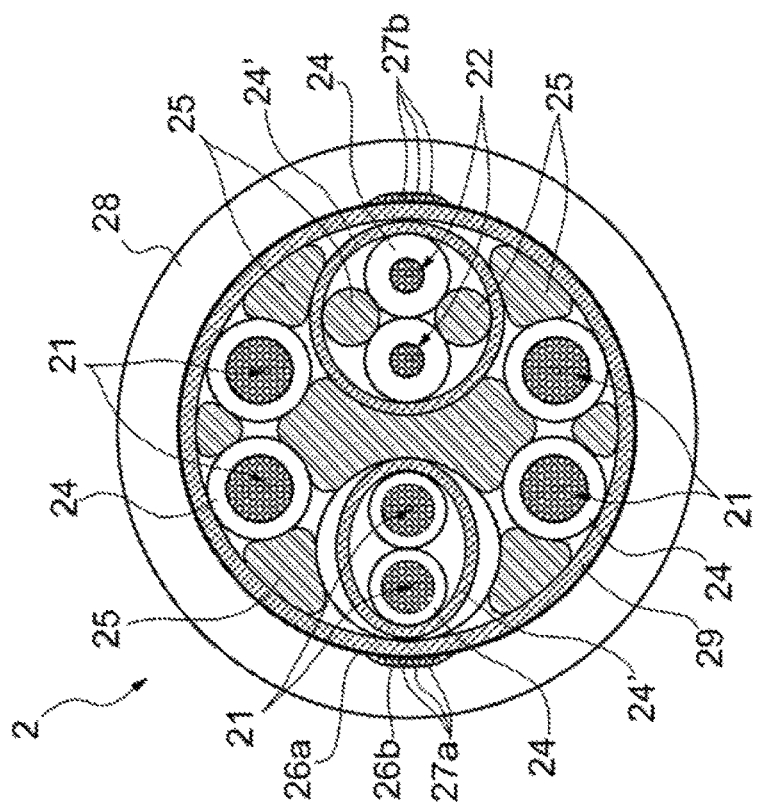
FIG. 2a shows the cross section of an electric cable in the wiring system of FIG. 1, in a possible embodiment.

In greater detail, and with reference to FIGS. 2A-2B, the electric cable 2 of the wiring system 1, of the multipolar-type, comprises, internally, a plurality of conductors, for the transmission of power and of data or signals, and in particular power conductors 21, in the example shown in a number equal to four for supplying the electric motor 4, and in a number equal to two to implement the so-called engine brake; and data conductors 22, in the example shown, arranged in a pair of twisted conductors, for the transmission of data and control signals between the control unit 3 and the electric motor 4.

In a possible embodiment, the twisted pair of the data conductors 22 can be used both to supply an encoder (or other sensor) associated with the electric motor 4, and to convey the data generated by the same encoder (or other sensor), being, for this purpose, present on the pair of data conductors 22 a direct voltage, for example comprised in the range 7-12 V.

Each power or data conductor 21, 22 is composed of a suitable number of conductive wires (or strands) and is sheathed and/or shielded by a respective sheath 24 made of insulating material; the conductors arranged in pairs are also arranged inside a respective conductive screen 24'. Among the conductors, a plastic reinforcement and/or filling material 25 may also be present.

The electric cable 2 furthermore comprises two layers of insulating material, and in particular an inner insulating layer 26a and an outer insulating layer 26b, as well as usually a protective outer sheath 28, which forms the interface with the external environment, and an overall electric shielding 29, placed between the inner insulating layer 26a and the internal structure of the electric cable 2 (that is formed, as indicated, by the assembly of the conductors and of the filling material).

According to an aspect of the present solution, the monitoring system 10 envisages to provide the electric cable 2, designed to carry out the required functions, of one or more groups formed by the assembly of one or more monitoring conductors, dedicated to monitoring operations of the operating state of the electric cable 2, placed inside the outer protective sheath 28, wound as a coil outside and around the functional elements of the electric cable 2, or arranged, always remaining external to the functional elements, longitudinally to the direction of extension of the same electric cable 2.

These dedicated monitoring conductors are used to create a wear "sensor" of the cable, according to what will be clarified in the following.

In the simplest solution, the electric cable 2 can be provided with only one group of dedicated monitoring conductors, even formed by a single conductive wire, while implementations can also be possible with two or more groups formed by one or more conductive wires, respectively. By group, it is generally meant in this context, a set of one or more equipotential conductive wires.

The choice of the solution to be adopted will be the compromise between simplicity, linked to the lower number of groups of monitoring conductors to be inserted under the protective outer sheath 28 of the electric cable 2, the need to cover the largest surface to guarantee the sensitivity in each point of the same sheath and consequently a greater number of groups of monitoring conductors, and the reliability of the monitoring system 10, which suggests the redundant presence of several conductive wires in a same group.

In the example shown in the above FIGS. 2A-2B, the monitoring system 10 envisages at least two groups of monitoring conductors 27a and 27b, formed of respective conductors electrically insulated with respect to the conductors of the other group, dedicated to the monitoring operations of the wear state of the electric cable 2, arranged between the inner insulating layer 26a and the outer insulating layer 26b of the same electric cable 2; the monitoring conductors 27a, 27b are also electrically insulated from the power and data conductors 21, 22 of the electric cable 2.

The groups of monitoring conductors 27a, 27b are preferably wound coil-wise along the entire length of the electric cable 2, as in the example shown in FIG. 2B, keeping the same always radially opposed, that is, maximizing the distance between the two groups and guaranteeing the overall electrical insulation between the conductors of the two groups. In some cases, a further layer of insulating material can be provided, interposed between the inner insulating layer 26a and the outer insulating layer 26b, placed between the two groups of monitoring conductors 27a, 27b, as a further guarantee of the electrical insulation between the monitoring groups.

As it is evident, the described insertion of one or more groups of monitoring conductors 27a, 27b can be carried out during production, on an industrial type cable, without varying the general mechanical or electrical characteristics; moreover, this modification can be carried out at decidedly contained costs.

Returning for the moment to FIG. 1, the monitoring system 10 can comprise, furthermore, as shown schematically, (one or more) optional sensors 30 designed to detect further specific properties of the electric cable 2, such as temperature (by means of one or more temperature probes) or performed movement cycles (by means of one or more accelerometers). These sensors are in this case arranged on the electric cable 2, at points of interest, and in the preferred embodiment placed together with the local monitoring system described hereinafter, in the example at the second connector 6. Purpose of these sensors 30 is to gather further useful information on the real conditions of use of the wiring system 1; this information, combined with the information on the wear state provided by the monitoring conductors 27a, 27b, allows to always have a complete overview of the operating conditions of the considered wiring system 1.

According to one aspect of the present solution, the monitoring system 10 further comprises an "intelligent" electronic device, hereinafter, monitoring device 32, which forms the local system for monitoring the wear state of the electric cable 2, coupled to the monitoring conductors 27a, 27b and also designed to collect and process the signals coming from possible sensors 30 (temperature probes, accelerometers, etc.).

The monitoring device 32 is coupled to the wiring system 1, preferably at an end of the electric cable 2, in proximity to the second connector 6, or preferably housed inside the same connector 6, inside a respective casing, as described in detail in the following.

During operation, the monitoring conductors 27a, 27b, placed under the protective outer sheath 28 of the electric cable 2, have the purpose of operating as sensors for the wear state of the cable. For example, in the case of abrasion of the protective outer sheath 28, these monitoring conductors 27a, 27b are the first to be uncovered and possibly damaged or interrupted, while the innermost (power and/or signal) conductors of the electric cable 2 continue to perform their function.

The monitoring device 32 exploits the group(s) of monitoring conductors 27a, 27b and one or more of their physical characteristics to establish whether the electric cable 2 is in normal operating conditions or if there are signs of damage and degradation.

The monitoring device 32 can, for example, measure an electric parameter associated with these monitoring conductors 27a, 27b, e.g. the electrical capacity between a pair of groups of monitoring conductors 27a, 27b, or the resistance of an electric path created by connecting two groups of monitoring conductors 27a, 27b to one another. Significant variations of the measured parameter/s can be usefully used to discriminate a normal operating condition of the electric cable 2 from an abnormal operating condition.

For example, a way that can be used to evaluate the wear state of the electric cable 2 is to electrically connect a pair of monitoring conductors groups 27a, 27b to one another, at the end of the electric cable 2 opposite to the one where the monitoring device 32 is located, thereby creating a closed electric circuit. The monitoring device 32 can then monitor the series resistance of this electric circuit and react if the value of this resistance deviates, beyond a threshold value, from an initial resistance value, or in an even simpler manner it can monitor the opening of the electric circuit as an indicator of damage of the electric cable 2.

In the case where only one group of monitoring conductors 27a, 27b is used, the aforesaid closed circuit can in any case be obtained by using another conductor already present in the electric cable 2, for example a braided shield or a suitable conductor. In the case in which several pairs of monitoring conductor groups 27a, 27b are used, these may also be connected so as to originate multiple closed monitoring circuits or, advantageously, be connected in series to one another so as to form a single closed monitoring circuit.

In general, the monitoring device 32 can also exploit other features of the monitoring conductors 27a, 27b, to deduce the wear or normal operation condition of the electric cable 2.

The purpose of the monitoring device 32 is in any case the continuous, or at preset time intervals, monitoring of the monitoring data indicative of the state of the electric cable 2 and of the output of the sensors 30, the processing of the same data, the comparison of the detected values with possible reference values, the activation of possible actions deriving from the comparison result (for example alarms, or alarm communications), the transmission of these results to an external remote system (for example to the control unit 3 and/or to a remote storage unit of the cloud storage type), the storing of these results in a local memory.

In particular, according to an aspect of the present solution, the monitoring device 32 is configured to exploit the voltage present on one or more of the pre-existing conductors of the electric cable 2 and to obtain its power supply from this voltage, thus rendering the presence of a power supply battery or a dedicated power supply unit superfluous, with all the resulting advantages (reduction of space, absence of periodic battery replacement, etc.).

Moreover, according to a further aspect of the present solution, the monitoring device 32 is configured to exploit one or more of the pre-existing conductors of the same electric cable 2, designed for data transmission or for other purposes of control and management of the electric motor 4, for the transport of the monitoring data on the state of the wiring system 1, making an autonomous communication system, for example via radio (wireless), or via cable by means of conductors specifically added to the electric cable 2, superfluous, with considerable advantages again in terms of implementation costs and complexity.

It is also to be considered that in some cases the conductors from which to obtain the energy for the operation of the monitoring device 32 and those already present in the electric cable 2 to transmit the monitoring data can coincide.

Figure 3:
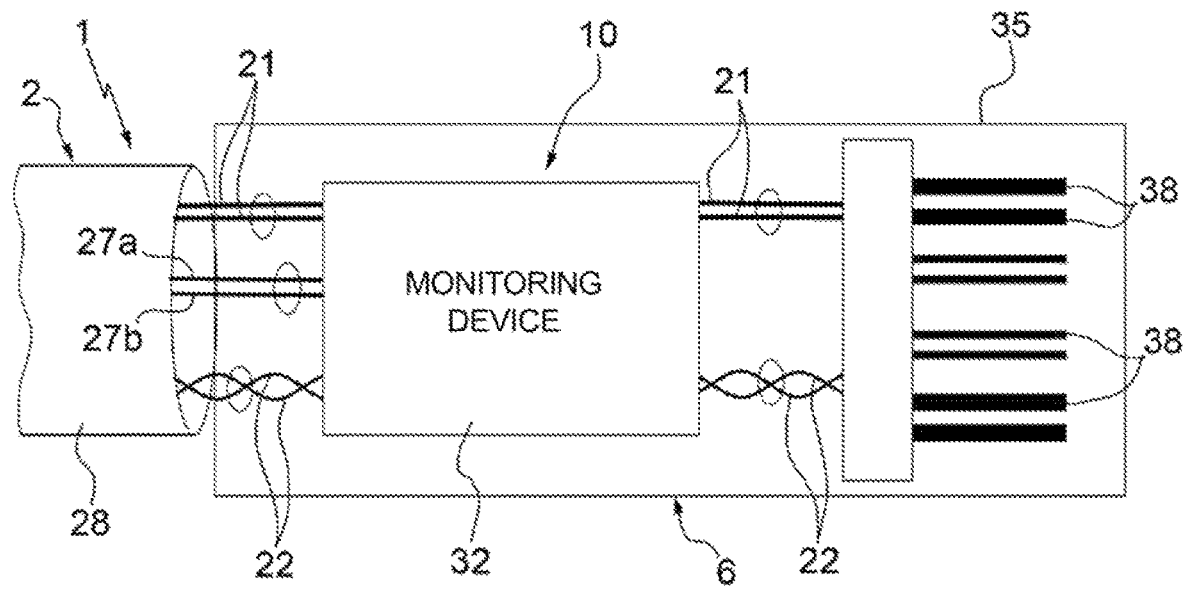
FIG. 3 is a block diagram of the monitoring system housed in a connector of the wiring system, in a first embodiment.

In greater detail, FIG. 3 shows the second connector 6, to be connected for example to the moving motor, of the electric cable 2 according to an aspect of the present solution.

The monitoring device 32 is, in this case, housed inside a shell, or a casing, 35 of the same second connector 6, which in turn is fixed to the respective end of the electric cable 2.

The monitoring device 32 receives at its input the ends of the monitoring conductors 27a, 27b, and also the ends of one or more of the power conductors 21 and of one more of the data conductors 22 (in this case arranged in twisted pairs) of the electric cable 2.

The ends of the power conductors 21 and of the data conductors are also electrically coupled to contact terminals (or pins) 38 of the second connector 6, so as to allow the coupling, in a known manner not illustrated herein, with a respective connector of the electric motor 4 (or of a different electric device), so as to supply the power (or drive) signals and exchange the signals and control data.

It should be noted, in particular, that also the ends of one or more of the power conductors 21 and of one or more of the data conductors 22 of the electric cable 2 reach respective contact terminals 38 of the second connector 6, so as to perform their power supply and/or control function, as desired. In contrast, the monitoring conductors 27a, 27b end at the monitoring device 32.

The monitoring device 32 is therefore housed inside the casing 35 of the second connector 6, interposed along the path of the power and data conductors 21, 22 towards the respective contact terminals 38.

Figure 4:
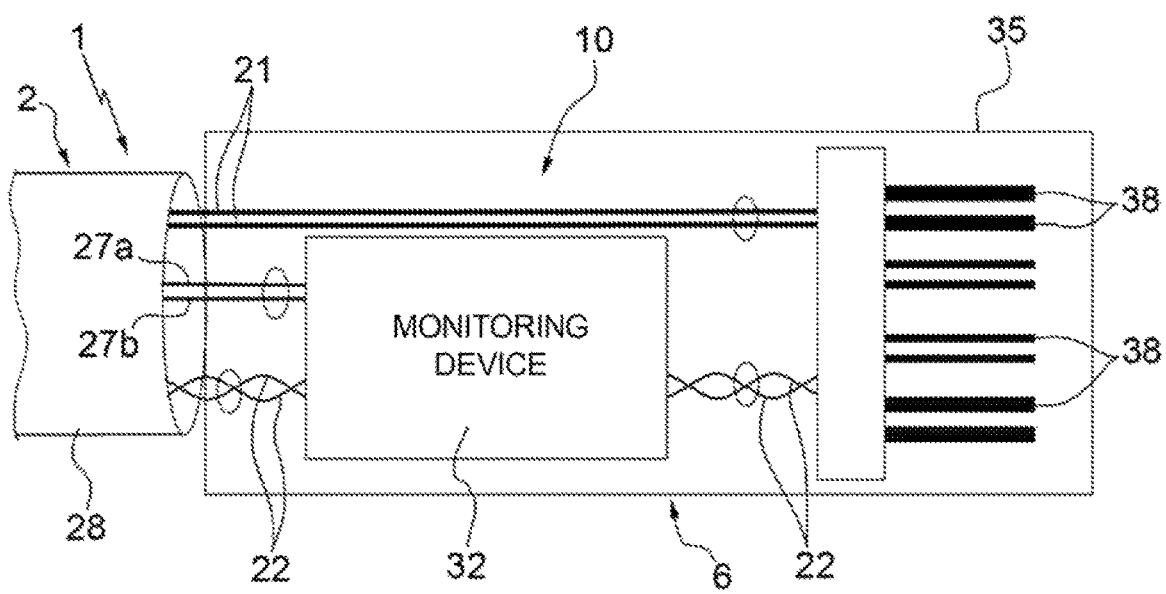
FIG. 4 is a block diagram of the monitoring system housed in a connector of the wiring system, in a second embodiment.

FIG. 4 shows a different embodiment of the monitoring system 10, in which the monitoring device 32, once again inserted into the second connector 6 of the wiring system 1, obtains its power supply from the twisted pair of data conductors 22, already present in the electric cable 2 for the transmission of the signals and control data, which is used by the same monitoring device 32 also for the transmission on the outside of the monitoring data related to the condition of the electric cable 2.

This solution, when possible (in the case in which the data conductors 22 are set at a given voltage), is advantageous since it is even more simple and inexpensive to implement, and provides an even smaller size.

Figure 5:
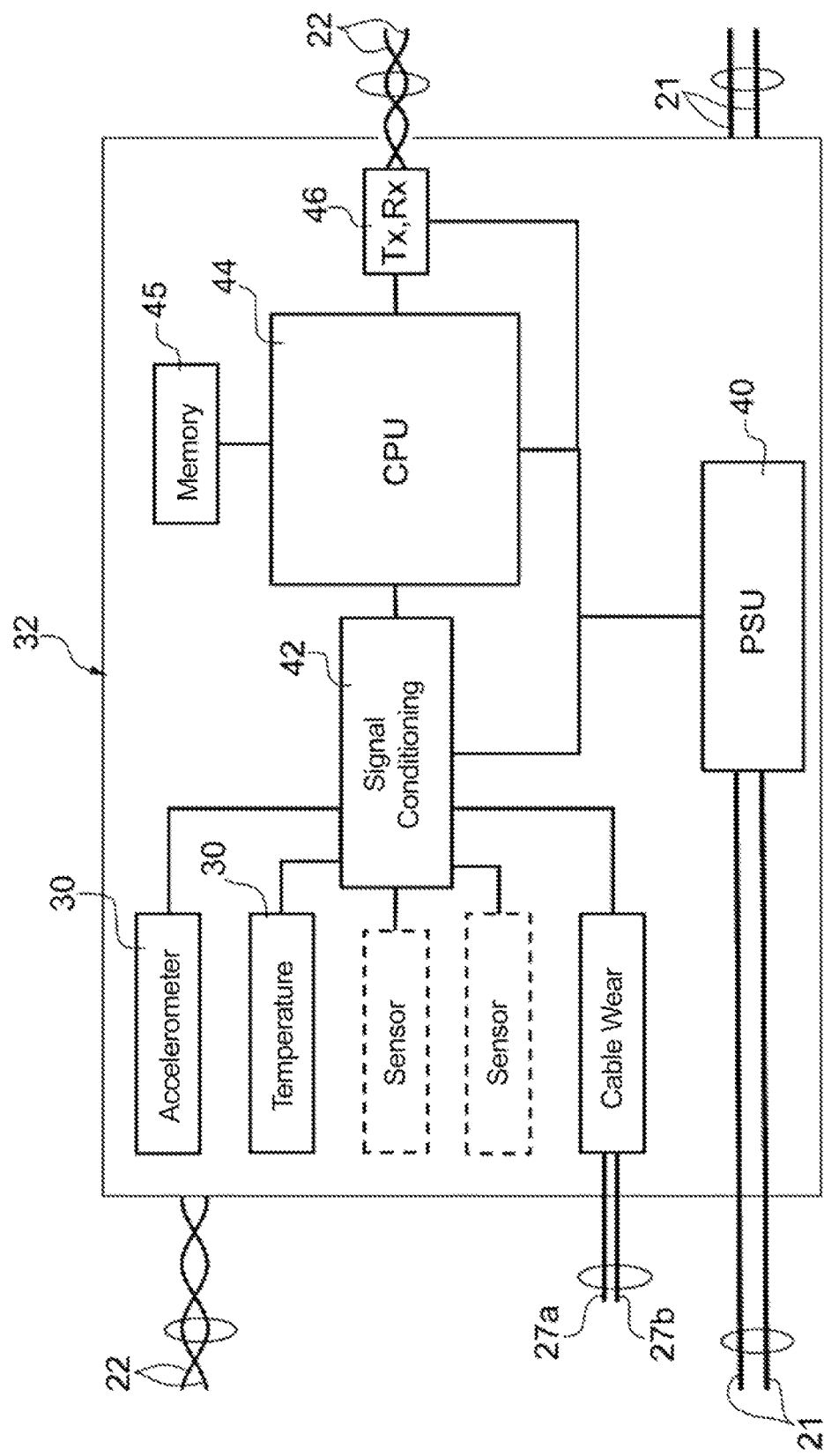
FIG. 5 is a more detailed block diagram of the monitoring system, according to a further aspect of the present solution.

With reference to FIG. 5, a possible implementation of the monitoring device 32 is now described in greater detail.

The monitoring device 32 can be described as an electronic circuit which comprises: a power supply unit 40 (PSU—Power Supply Unit); a signal conditioning stage 42; a central control unit 44, for example provided with a microprocessor (CPU—Central Processing Unit), a microcontroller or a similar digital processing unit; a local memory 45 of a non-volatile type; and a transmission and reception stage 46.

The monitoring device 32 can further comprise, in an integrated manner, or externally coupled thereto, the sensors 30 previously disclosed, for example one or more temperature sensors and one or more accelerometers.

In particular, the power supply unit 40 provides the power supply to the electronic components of the monitoring device 32, and to the local or remote sensors 30 connected to the same monitoring device 32.

As previously indicated, the same power supply unit 40 obtains energy from one or more power conductors 21 normally already present in the electric cable 2 and designed to supply power to other elements of the system (e.g. electric motors, encoders, sensors) and/or from one or more data conductors 22 designed for data transmission (e.g. by a respective twisted pair); converts the same energy to suitable voltage values and distributes it to the various components of the monitoring device 32.

The signal conditioning stage 42 is connected to the sensors 30, for example comprising one or more temperature probes and/or one or more accelerometers having one or more axes and/or additional sensors, and to the monitoring conductors 27a, 27b, or to an electric circuit made by the same, to monitor the wear state of the electric cable 2.

The signal conditioning stage 42 has the purpose of interfacing with the sensors 30, by providing the possible power supply and/or the electrical biasing signals required to collect the detection signals generated by the same sensors 30, and of performing appropriate processing operations (amplification, linearization or other), such as to adapt the signals coming from the different sensors 30 to the subsequent processing steps.

In particular, if the monitoring conductors 27a, 27b arranged under the protective outer sheath 28 of the electric cable 2 have been connected so as to form a closed electric circuit, the signal conditioning stage 42 generates a signal suitable for evaluating the continuity, or not, of the same electric circuit (for example, by measuring whether the electric circuit is suitable to convey an electric current, which therefore serves to discriminate the normal condition of the electric cable 2, i.e. with the passage of the electric current, from that of failure, i.e. with interruption in the passage of the electric current); or, the same signal conditioning stage 42 generates a suitable electric current which serves to measure the resistance of the electric circuit, thus allowing evaluations of the variation of this resistance over time so as to establish, again, the wear conditions of the electric cable. 2.

The central control unit 44 controls the operation of the monitoring device 32, manages the timings of the various functions, receives and further processes the signals coming from the signal conditioning stage 42 and is able to compare the value of these signals with preset thresholds values, thus generating consequent actions such as alarms and notifications.

The central control unit 44 also manages the storage in the local memory 45 of the monitoring data and manages remote access queries and requests to the same monitoring data, for example from the control unit 3 associated with the wiring system 1 or from external electronic devices; the processing unit 44 also controls and manages the transmissions of the monitoring data through the transmission and reception stage 46.

This transmission and reception stage 46, under the control of the central control unit 44, implements the transmission and reception of the monitoring data, by encoding and decoding the data according to protocols suitable for transmission on the physical carrier provided by the one or more data conductors 22 designed for data transmission.

In particular, the pair of data conductors 22 will generally be involved in the transmission of the data relating to the control of the electric motor 4 (for example, the data associated with the encoder, data which require a continuous transmission, in "real time"), while the monitoring device 32 will be enabled to use the transmission bus only at preset times or in any case in time slots in which the electric motor 4, or the related encoder, is not already engaged. This mode of operation is in any case effective, since the wear and damage of the protective outer sheath 28 of the electric cable proceeds slowly and progressively, so that instantaneous corrective action is not normally required (the functionality of the electric cable 2 is not immediately compromised).

The monitoring device 32 can therefore monitor in real time the monitoring conductors 27a, 27b and possible other sensors (temperature sensors, accelerometers, or other), storing the relevant data in the local memory 45; when the preset time comes, the monitoring device 32 sends the acquired monitoring data to the control unit 3 and/or to a remote external memory (see the remote memory 11 of FIG. 1, for example), by using the twisted pair of data conductors 22.

The monitoring data transmitted by the monitoring device 32 to the control unit 3 associated with the electric motor 4 can then be transferred from the same control unit 3 by exploiting existing data networks in the plant, and stored in remote memory areas (server, NAS, cloud storage), accessible by means of special interfaces, electronic devices 12, personal computers, smartphones, tablets, etc.

It is thus possible to query the monitoring device 32, access the data stored in the local memory 45, display and extract the monitoring data and/or the data stored in the same local memory 45 for the most disparate purposes; it is also possible to receive and display messages and notifications relating to the state of the wiring system 1 (indicative of alarms, of reaching of threshold values, etc.) at the same electronic devices 12.

The advantages of the present solution emerge clearly from the preceding description.

In any case, it is again underlined that the solution described provides a particularly compact system to monitor the condition of a wiring system, which is simple and inexpensive to implement, that allows the monitoring of the wear state and any other characteristics of the wiring system, in continuous time or at preset time intervals.

The described system can be usefully used in conjunction with wiring systems for industrial systems in automation and robotics field, for example to connect electric motors in motion with their control systems, without having to modify the same electric motor or control system, offering the advantage of making available in real time the state of use and wear of the same wiring system.

The monitoring system, which is simple and effective to implement, can easily be integrated into the electronic system for controlling and managing the electric motor. Alternatively, the monitoring system can advantageously constitute an autonomous system where information on the status of the electric cable, or of several monitored electric cables, is collected and stored, with the possibility of using and managing the same information for various purposes, including the management of alarms, monitoring the state of a cable network, performing a targeted maintenance, processing statistics, etc.

In particular, the availability of this monitoring data allows the implementation of a form of predictive maintenance of the wiring, i.e. intervening to replace and/or repair a wiring only when it is really worn, as indicated by the monitoring system. In these cases, the maintenance intervention can be programmed in a convenient manner, without particular urgency, minimizing costs and downtimes of the plant, because, in the event of a wear warning, the functionality of the cable is still guaranteed for a given time. In addition to the economic advantage (replacing a wiring only when really necessary) the system improves the safety of the plants for the processing and for the personnel by limiting the occurrence of sudden failures with unexpected consequences.

Finally, it is clear that modifications and variations can be made to what has been described and illustrated herein without thereby departing from the scope of protection, as defined in the attached claims.

In particular, it should be noted again that, according to the type of electric cable 2, it can be possible to use a single group of monitoring conductors 27a, 27b, placed between the inner insulating layer 26a and the outer insulating layer 26b of the electric cable 2. It should also be noted that the group, or the groups of dedicated monitoring conductors, can also be placed along the electric cable 2 following its longitudinal development direction, that is, the length of the electric cable 2; in that case, to guarantee a good coverage of the surface of the electric cable 2, resulting in a radially uniform sensitivity to the wear of the outer protective sheath 28, it is preferable to have a greater number of dedicated monitoring conductor groups, adapted for covering the entire cable length and adapted to form further electrically closed circuits or, in an advantageous manner, adapted to be connected in series with each other, obtaining a single closed monitoring circuit.

It is also evident that the number or type of conductors used in the electric cable 2 of the wiring system 1 may differ from what has been described and illustrated above, depending on the application of the same wiring system 1.

The invention claimed is:

1. A monitoring system to monitor a condition of an industrial wiring system provided with a hybrid multipolar electric cable having a number of electric conductors having a power transmission and data transmission functions and enclosed inside a protective sheath, comprising:
    monitoring conductors, to monitor wear of the electric cable, arranged inside said protective sheath and electrically insulated from said electric conductors; and
    a monitoring device, operatively coupled to said monitoring conductors and configured to detect at least one electric parameter associated with said monitoring conductors in order to detect the wear of the electric cable and generate corresponding monitoring data,
    wherein said monitoring device is configured to obtain its own power supply from electric conductors of said electric cable, and/or to transmit said monitoring data by means of electric conductors of said electric cable;
    wherein said monitoring device comprises a power supply unit coupled to said electric conductors in order to obtain the power supply from at least one of said electric conductors; a signal conditioning stage, coupled to said monitoring conductors in order to detect said at least one electric parameter associated with said monitoring conductors, in order to detect the wear of the electric cable; a central unit, coupled to said power supply unit in order to receive said power supply, and coupled to said signal conditioning stage so as to generate the monitoring data indicative of the wear of said electric cable according to said at least one electric parameter; a local memory, coupled to said central unit and configured to store said monitoring data; and a transmission and reception stage coupled to at least one of said electric conductors for the transmission of said monitoring data;
    wherein said industrial wiring system is designed to electrically connect a control unit to an electric user device, in order to transmit power to supply said electric user device, and to transmit said data for the control of said electric user device, and it is further provided with a connector for coupling to said electric user device;
    wherein said monitoring device is housed inside a casing of said connector, interposed along a path of said electric conductors towards respective contact terminals of said connector.

2. The monitoring system according to claim 1, wherein said electric conductors comprise at least one power conductor for the transmission of said power and at least one data conductor for the transmission of said data; and
wherein said monitoring device is configured to obtain its own power supply from said at least one power conductor, and to transmit said monitoring data through said at least one data conductor.

3. The monitoring system according to claim 2, wherein said at least one data conductor is designed to convey control data for the control of said electric user device, coming from said control unit; said monitoring device being configured to transmit said monitoring data to said control unit at distinct time intervals with respect to the transmission of said control data from said control unit to said electrical user device.

4. The monitoring system according to claim 1, wherein said electric conductors comprise at least one power conductor for the transmission of said power and at least one data conductor for the transmission of said data; and
wherein said monitoring device is configured to obtain its own power supply and to transmit said monitoring data through said at least one data conductor.

5. The monitoring system according to claim 1, wherein said monitoring conductors comprise at least a first and a second group of monitoring conductors, which are electrically insulated from one another, and said monitoring device is coupled to said monitoring conductors in order to obtain said electric parameter as an electric capacitance, or as an electric resistance present between said first and second groups of monitoring conductors.

6. The monitoring system according to claim 5, wherein said monitoring device is coupled to said monitoring conductors in order to define a closed electric circuit between said monitoring conductors of said first and second groups, in order to detect said electric parameter.

7. The monitoring system according to claim 1, wherein said central unit of said monitoring device is configured to control access to said monitoring data stored in said local memory, from an outside of said monitoring device.

8. A monitoring system to monitor a condition of an industrial wiring system provided with a hybrid multipolar electric cable having a number of electric conductors having a power transmission and data transmission functions and enclosed inside a protective sheath, comprising:
monitoring conductors, to monitor wear of the electric cable, arranged inside said protective sheath and electrically insulated from said electric conductors;
a monitoring device, operatively coupled to said monitoring conductors and configured to detect at least one electric parameter associated with said monitoring conductors in order to detect the wear of the electric cable and generate corresponding monitoring data, and
sensors, coupled to said electric cable to detect further operating parameters of said electric cable;
wherein said monitoring device is configured to obtain its own power supply from electric conductors of said electric cable, and/or to transmit said monitoring data by means of electric conductors of said electric cable;
wherein said monitoring device comprises a power supply unit coupled to said electric conductors in order to obtain the power supply from at least one of said electric conductors; a signal conditioning stage, coupled to said monitoring conductors in order to detect said at least one electric parameter associated with said monitoring conductors, in order to detect the wear of the electric cable; a central unit, coupled to said power supply unit in order to receive said power supply, and coupled to said signal conditioning stage so as to generate the monitoring data indicative of the wear of said electric cable according to said at least one electric parameter; a local memory, coupled to said central unit and configured to store said monitoring data; and a transmission and reception stage coupled to at least one of said electric conductors for the transmission of said monitoring data; and
wherein said monitoring device is further operatively coupled to said sensors and is configured to detect the wear of the electric cable and generate the corresponding monitoring data also as a function of said further operating parameters.

9. The monitoring system according to claim 8, wherein said sensors comprise at least one temperature sensor and/or at least one acceleration sensor.

10. The monitoring system according to claim 1, wherein said electric cable comprises an inner insulating layer, which surrounds and covers said electric conductors, and an outer insulating layer, arranged externally and separated from said inner insulating layer; wherein said monitoring conductors are arranged between said inner insulating layer and said outer insulating layer.

11. The monitoring system according to claim 1, wherein said monitoring data are configured to allow a predictive maintenance of said industrial wiring system.

12. An industrial wiring system, comprising a hybrid multipolar electric cable having a number of electric conductors, having a power and/or data transmission function, enclosed inside a protective sheath, comprising a monitoring system to detect the wear of said electric cable, the monitoring system comprising:
monitoring conductors, to monitor wear of the electric cable, arranged inside said protective sheath and electrically insulated from said electric conductors; and
a monitoring device, operatively coupled to said monitoring conductors and configured to detect at least one electric parameter associated with said monitoring conductors in order to detect the wear of the electric cable and generate corresponding monitoring data,
wherein said monitoring device is configured to obtain its own power supply from electric conductors of said electric cable, and/or to transmit said monitoring data by means of electric conductors of said electric cable;
wherein said monitoring device comprises a power supply unit coupled to said electric conductors in order to obtain the power supply from at least one of said electric conductors; a signal conditioning stage, coupled to said monitoring conductors in order to detect said at least one electric parameter associated with said monitoring conductors, in order to detect the wear of the electric cable; a central unit, coupled to said power supply unit in order to receive said power supply, and coupled to said signal conditioning stage so as to generate the monitoring data indicative of the wear of said electric cable according to said at least one electric parameter; a local memory, coupled to said central unit and configured to store said monitoring data; and a transmission and reception stage coupled to at least one of said electric conductors for the transmission of said monitoring data;
wherein said electric cable is configured to electrically couple a control unit to an electric user device to transmit said power so as to supply power to said electric user device, and to transmit said data so as to control said electric user device, and it is further provided with a connector for coupling to said electric user device; and wherein said monitoring device is housed inside a casing of said connector, interposed along a path of said electric conductors towards respective contact terminals of said connector.

13. The wiring system according to claim 12, wherein an electric user device is an electric motor associated with a moving element and said connector is designed to be moved, in an integral manner with said electric motor.

* * * * *